United States Patent [19]

Koike et al.

[11] Patent Number: 4,511,645
[45] Date of Patent: Apr. 16, 1985

[54] PHOTOSENSITIVE PLATE FOR LITHOGRAPHIC PRINTING PLATE

[75] Inventors: Mitsuru Koike; Kesanao Kobayashi; Tadao Toyama; Hiroshi Misu, all of Shizuoka; Koji Tamoto, Kanagawa; Masayuki Iwasaki, Shizuoka, all of Japan

[73] Assignee: Fuji Photo Film Co., Ltd., Kanagawa, Japan

[21] Appl. No.: 530,821

[22] Filed: Sep. 9, 1983

[30] Foreign Application Priority Data

Sep. 9, 1982 [JP] Japan .................................. 57-157198

[51] Int. Cl.³ .......................... G03C 1/94; G03C 1/68
[52] U.S. Cl. ..................................... 430/276; 430/278; 430/287; 430/288; 430/285; 430/910; 430/927; 430/300; 204/159.16
[58] Field of Search ............... 430/300, 285, 287, 288, 430/278, 910, 927, 276; 204/159.16

[56] References Cited

U.S. PATENT DOCUMENTS

| | | | |
|---|---|---|---|
| 3,376,138 | 4/1968 | Giangualano et al. | 430/302 X |
| 3,796,578 | 3/1974 | Hosoi et al. | 430/280 |
| 3,825,430 | 7/1974 | Kurka | 430/287 |

FOREIGN PATENT DOCUMENTS

| | | | |
|---|---|---|---|
| 2405915 | 2/1974 | Fed. Rep. of Germany | 430/288 |
| 1329714 | 9/1973 | United Kingdom . | |
| 0781746 | 11/1980 | U.S.S.R. | 430/285 |
| 0911443 | 3/1982 | U.S.S.R. | 430/285 |

Primary Examiner—John E. Kittle
Assistant Examiner—Cynthia Hamilton
Attorney, Agent, or Firm—Sughrue, Mion, Zinn Macpeak & Seas

[57] ABSTRACT

A presensitized printing plate which has a photopolymerizing composition layer provided on at least one side of a support, with the photopolymerizing composition being constituted with (A) a polymer containing in its side chains groups represented by the following general formula (I) and carboxylic groups:

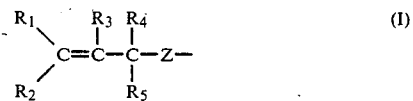

(wherein $R_1$ to $R_5$ each represents a hydrogen atom, a halogeno group, a carboxyl group, a sulfo group, a nitro group, a cyano group, and amido group, an amino group, or an unsubstituted or a substituted alkyl, aryl, alkoxy, aryloxy, alkylamino, arylamino, alkylsulfonyl or arylsulfonyl group; and Z represents an oxygen atom, a sulfur atom, —NH— or —NR— (R=alkyl)), (B) a monomer or an olygomer having at least two polymerizable ethylenically unsaturated double bonds, and (C) a photopolymerization initiator.

12 Claims, No Drawings

PHOTOSENSITIVE PLATE FOR LITHOGRAPHIC PRINTING PLATE

FIELD OF THE INVENTION

This invention relates to a presensitized printing plate and more particularly, to a presensitized printing plate including a novel photopolymerizing photosensitive composition improved in the stability of the sensitivity it exhibits at a plate-making operation.

BACKGROUND OF THE INVENTION

There have been many attempts to use photopolymerizing compositions as photosensitive image-forming layers of presensitized printing plates. Basic compositions are disclosed in a number of publications. For example, U.S. Pat. No. 3,458,311 discloses a composition comprising binder polymers, monomers and photopolymerizing initiators. U.S. Pat. No. 3,796,578 discloses composition having improved hardening efficiency obtained by introducing unsaturated double bonds into polymers to be used as binders. Compositions in which novel photopolymerization initiators are employed are disclosed in U.S. Pat. Nos. 3,549,367 and 3,751,259 and British Pat. No. 1,388,492. Only a part of these compositions are put to a practical use. However, each of these compositions is not desirable because the sensitivity is greatly influenced by the surface temperature which the resulting presensitized printing plate has at the time of imagewise exposure (which phenomenon is called temperature dependance, hereinafter).

More specifically, it has been found that changes in the sensitivity occur under ordinary plate-making conditions. In some cases the sensitivity may change by 2 to 8 times. More specifically if 10 seconds of exposure is required for producing the optimum image in a presensitized printing plate when the temperature of the plate surface is 45° C., 20 to 80 seconds' exposure is necessitated when the plate is 10° C. Otherwise a satisfactory image can not be formed. In view of plate-making conditions, however, a plate surface temperature of 10° C. is possible when working in the early morning of winter, and it is not uncommon for the plate surface temperature to reach 45° C. or higher by absorption of heat emitted from a light source when work is being carried out continuously and the printing frame is arranged at a short distance from the light source.

Under these circumstances, it is most unlikely that images of the same quality can be formed stably with the same exposure.

In addition, photopolymerizing compositions have turned out to have another disadvantage that postpolymerization caused by residual active species is observed in the photopolymerizing compositions after cessation of imagewise exposure. Accordingly, the longer the interval from imagewise exposure to development becomes, the higher the sensitivity goes up (which phenomenon is called latent image progression, hereinafter).

In practice, the sensitivities of photopolymerizing compositions may be increased by up to 2 to 8 times due to latent image progression, and this may occur with photopolymerizing compositions disclosed in the above-described patent specifications. This phenomenon becomes a serious impediment to the processing of photopolymerizing compositions into presensitized printing plates, because on a plate-making site there are distinct differences in the thickness of image lines and the tone of image patterns between when development is carried out just after imagewise exposure and when development is carried out some time after imagewise exposure.

SUMMARY OF THE INVENTION

As the result of many investigations on methods which aid in reducing the above-described temperature dependence and latent image progression and therefore aid in constantly stabilized image formation, the present inventors have developed the present invention.

Accordingly, an object of this invention is to provide a presensitized printing plate which uses a photopolymerizing composition which is hardly influenced by temperature upon imagewise exposure and further, which suppresses change in sensitivity which depends on the interval from imagewise exposure to development, resulting in constantly stabilized image formation.

The above-described object is attained by using a photopolymerizing composition, comprising:

(A) a polymer containing in its side chains groups represented by the following general formula (I) and carboxylic groups;

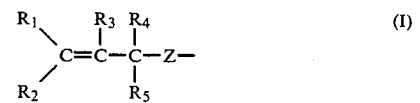

(wherein $R_1$ to $R_5$ each represents a hydrogen atom, a halogeno group, a carboxyl group, a sulfo group, a nitro group, a cyano group, an amido group, an amino group, or an unsubstituted or a substituted alkyl, aryl, alkoxy, aryloxy, alkylamino, arylamino, alkylsulfonyl or arylsulfonyl group; and Z represents an oxygen atom, a sulfur atom, —NH— or —NR— (R=alkyl)), (B) a monomer or an olygomer having at least two polymerizable ethylenically unsaturated double bonds, and (C) a photopolymerization initiator.

DETAILED DESCRIPTION OF THE INVENTION

Suitable supports which can be used in the presensitized printing plate of this invention are dimentionally stable plate-form materials, and include all of materials used in conventional printing plates. Specific examples thereof are sheets of paper; paper laminated with plastics such as polyethylene, polypropylene, polystyrene or the like film; plates of metals such as aluminium (including alloys thereof), zinc, copper, etc.; films of plastics such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.; paper or plastic films laminated or evaporated with the above-described metals; and so on. Among these supports, aluminium plate is especially preferable because of its remarkably high dimentional stability and low price. In addition, a composite sheet in which an aluminium sheet is firmly attached to a polyethylene terephthlate film, as described in Japanese Patent Publication No. 18327/73, is also excellently suited to serve as a support.

In case of the supports having metal surfaces, especially aluminium, it is desirable to subject them to surface treatments such as a graining treatment, a dip treatment in a aqueous solution of sodium silicate, potassium fluorozirconate, phosphate or so on, an anodic oxidation treatment, etc. In addition, an aluminium plate which has received a graining treatment and a dip treatment in a water solution of sodium silicate, in this order, and an an aluminium plate which has received an anodic oxidation treatment and a dip treatment in a water solution of silicate of an alkali metal, as described in U.S. Pat. No. 3,181,461, are also used to advantage. The above-described anodic oxidation treatment is carried out by using the aluminium plate as the anode and passing electric current into an electrolytic solution which is an aqueous or a nonaqueous solution of an inorganic acid, e.g., phosphoric acid, chromic acid, sulfuric acid, boric acid, etc., or an organic acid, e.g., oxalic acid, sulfamic acid, etc., or the salt thereof, or a combination of two or more of the above-described solutions.

Further, electrodeposition of silicate, as described in U.S. Pat. No. 3,658,662; is also effective as the surface treatment.

Furthermore, a surface treatment which combines a support previously subjected to an electrolytic graining treatment with the above-described anodic oxidation treatment and sodium silicate treatment, as disclosed in published examined Japanese Patent Publication 27481/'71 and published unexamined Japanese Patent Application Nos. 58602/'77 and 30503/'77, is also used to advantage. Moreover, a surface treatment which involves, in sequence, a brush graining treatment, an electrolytic graining treatment, an anodic oxidation treatment and a sodium silicate treatment, as disclosed in published unexamined Japanese Patent Application No. 28893/'81, is also well suited. These surface treatments are taken not only for rendering surfaces of metal supports hydrophilic but also for preventing harmful reactions with photosensitive compositions to be provided thereon and further, for improving adhesiveness of surfaces of metal supports to photosensitive layers to be provided thereon.

The polymers (A) to be employed in this invention are characterized by having both unsaturated groups and carboxyl groups in their own molecules wherein the unsaturated groups are represented by the following general formula (I):

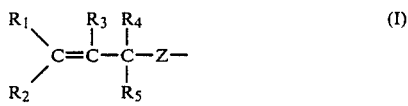
(I)

(wherein $R_1$ to $R_5$ each represents a hydrogen atom, a halogeno group, a carboxyl group, a sulfo group, a nitro group, a cyano group, an amido group, an amino group, or an unsubstituted or a substituted alkyl, aryl, alkoxy, aryloxy, alkylamino, arylamino, alkylsulfonyl or arylsulfonyl group; and Z represents an oxygen atom, a sulfur atom, —NH— or —NR— (R=alkyl)). More specifically, suitable halogeno groups for $R_1$ to $R_5$ may be fluoro, chloro, bromo or iodo group, and suitable alkyl groups for $R_1$ to $R_5$ in the formula (I) may be straight chain, branched chain or cyclic ones, and contain 1 to 7 carbon atoms. These alkyl groups may have substituents such as an alkoxy group having 1 or 2 carbon atoms, an alkoxycarbonyl group having 1 to 3 carbon atoms, a phenyl group, a hydroxy group or so on. Suitable aryl groups for $R_1$ to $R_5$ in the formula (I) are phenyl groups or furyl groups, which may have substituents such as a halogeno group (e.g., chloro, bromo or the like), a hydroxy group, an alkyl group containing 1 to 7 carbon atoms, an aryl group (e.g., phenyl, methoxyphenyl, etc.), an alkoxy group containing 1 to 7 carbon atoms, a nitro group, an amino group, an N,N-dialkylamino group or so on. Suitable alkoxy groups for $R_1$ to $R_5$ are those having 1 to 7 carbon atoms. Suitable aryloxy groups are phenyloxy groups, which may have substituents such as an alkyl group containing 1 to 7 carbon atoms, an alkoxy group having 1 to 7 carbon atoms, etc. Suitable alkylamino groups for $R_1$ to $R_5$ are those having 1 to 15 carbon atoms, and suitable arylamino groups therefore are phenylamino group and naphthylamino group. Suitable alkylsulfonyl groups for $R_1$ to $R_5$ are those having 1 to 15 carbon atoms, and suitable arylsulfonyl groups are a phenylsulfonyl group or the like, which may have a substituent such as an alkyl group containing 1 to 15 carbon atoms, an alkoxy group containing 1 to 5 carbon atoms, an amino group or so on.

The polymers (A) have a molecular weight of 10,000 to 100,000, preferably 20,000 to 70,000 and more preferably has 0.06 to 0.25 of intrinsic viscosity [$\eta$].

Compositions using binders which contain unsaturated groups are known, and disclosed in, e.g., U.S. Pat. No. 3,796,578 etc. However, these compositions are not improved with respect to their temperature dependence and latent image progression.

The polymers (A) to be employed in this invention are disclosed in U.S. Pat. Nos. 3,376,138; 3,556,792 and 3,556,793 (incorporated herein by reference to disclose such polymers). However, the polymers disclosed therein are used by themselves as photocross-linkable resist. Accordingly, such a usage is distinctly different from the usage in this invention in that the polymers (A) are employed as the binders of photopolymerizing compositions.

Methods for synthesizing the above-described polymer (A) are divided broadly into two categories.

Method I: The unsaturated group represented by the formula,

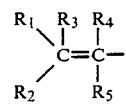

(wherein $R_1$ to $R_5$ have the same meanings as in the general formula (I) respectively), is introduced as a pendent group into a starting polymer having as side chains carboxylic acid groups, carboxylic acid halide groups or carboxylic acid anhydride groups, through a linking group of the formula

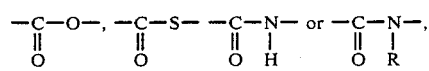

by reacting a compound represented by the general formula (I-a) described hereinafter with the starting polymer.

Method II: A monomer having both the unsaturated group represented by the above-described general formula (I) and an ethylenically unsaturated group having an addition polymerizing reactivity higher than that of the unsaturated group of the formula (I) is copolymerized with an unsaturated carboxylic acid.

Now, the compound represented by the general formula (I-a) is illustrated in detail below:

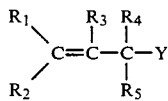

(I-a)

wherein $R_1$ to $R_5$ have the same meanings as in the general formula (I) respectively, and Y represents —OH, —SH, —NH$_2$, —NHR (R=alkyl) or a halogen atom.

The above-described Method I will now be described in detail below. Suitable example of the starting polymer include acrylic acid copolymers, methacrylic acid copolymers and copolymers which are produced by converting acrylic or methacrylic acid copolymers to the acid halides according to a high polymer reaction process. In addition, maleic acid anhydride copolymers and itaconic acid anhydride copolymers may also be employed as the starting polymer. Comonomers which can be employed for synthesizing the above-described copolymers include styrene or the alkyl substituted derivatives thereof, alkylacrylates, arylacrylates, alkylmethacrylates, arylmethacrylates and aliphatic vinyl esters. More preferable starting polymers are copolymers of acrylic acid or methacrylic acid with methylacrylate, ethylacrylate, butylacrylate, benzylacrylate, methylmethacrylate, ethylmethacrylate, butylmethacrylate or benzylmethacrylate. Introduction of the unsaturated group into these copolymers can be attained by admixing an unsaturated alcohol, amine, thiol or halide compound represented by the general formula (I-a) with the copolymers in a reaction solvent to dissolve them thereinto and then, adding a reaction catalyst and a polymerization inhibitor thereto, and heating them under a prescribed reacting condition. More specifically, Method I will be described in greater detail below by specifically referring to methacrylic acid-benzylmethacrylate copolymer.

In a 300-ml three neck flask equipped with an agitation rod and blade, a reflux condenser and a thermometer, 19.8 g of methacrylic acid/benzylmethacrylate (27/73 by mole) copolymer, 40.2 g of ethylene glycol monomethyl ether acetate as a reaction solvent, 6.0 g of allyl bromide as the reagent containing an unsaturated group, 10.4 g of trimethylbenzylammonium hydroxide as a catalyst and 0.01 g of paramethoxyphenol as a polymerization inhibitor were placed, and mixed and dissolved. The resulting mixture was heated to 70° C. under an atmosphere of nitrogen for a period of 13 hours with stirring. After cooling, methyl ethyl ketone was added thereto, and the thus liberated quaternary salt was removed. Further, the product was diluted with methanol, and poured into a dilute hydrochloric acid in order to precipitate. The precipitate obtained was washed with water, filtered with suction and dried under vacuum. Yield of the polymer was 13.6 g. Allyl group was introduced to the starting polymer in a proportion of 35% to the carboxylic acid group.

$[\eta]_{30}\cdot{}^{MEK}=0.161$.

Introduction of the unsaturated group into a maleic anhydride copolymer can be attained by using the method described in U.S. Pat. No. 2,047,398 (incorporated herein by reference to disclose such a method). According to such a method, the maleic anhydride moiety undergoes ring opening and thereto, an unsaturated ester, an saturated amide, an unsaturated thioester or the like is introduced. An analogous example of introducing unsaturated groups into maleic anhydride copolymers is reported in U.S. Pat. No. 3,905,820. According to such a method, the unsaturated groups are, however, bound to the nitrogen atom of maleic acid imide. Therefore, they differ distinctly from the above-described polymers, and are distinguished from the polymers (A) to be employed in this invention.

Method II will now be described in greater detail below. Monomers having the unsaturated groups and that, containing at least two or more of C—C double bonds are synthesized by allowing alcohols, amines, thiols or halides, which each has the unsaturated group, and unsaturated carboxylic acids, especially acrylic acid or methacrylic acid, to undergo condensation in a conventional manner. The thus synthesized monomers having at least two unsaturated groups are copolymerized with unsaturated carboxylic acids, preferably acrylic acid or methacrylic acid, to produce copolymers having the unsaturated groups. In addition to unsaturated carboxylic acids, other monomers such as alkylacrylates, alkylmethacrylates, benzylmethacrylate, 2-hydroxyethylmethacrylate, acrylonitrile and the like may be copolymerized with the above-described monomers having the unsaturated groups and C—C double bonds.

A synthesis example of copolymerizing allylmethacrylate and methacrylic acid according to Method II is described below more specifically. An analogous synthesis method is disclosed in U.S. Pat. No. 2,047,398 (incorporated herein by reference to disclose such a method).

In a 3-liter four neck flask equipped with an agitation rod and blade, a reflux condenser, a dropping funnel and a thermometer was placed 1.68 l of 1,2-dichloroethane as a reaction solvent, and heated to 70° C. as the atmosphere in the flask was replaced with N$_2$. 100.8 g of allylmethacrylate, 7.6 g of methacrylic acid and 1.68 g of 2,2'-azobis(2,4-dimethylvaleronitrile) as a polymerization initiator were dissolved in 0.44 l of 1,2-dichloroethane, and the resulting solution was put in the dropping funnel. The solution was dropped into the flask where it remained for 2 hours while the reaction mixture was being stirred. After the conclusion of the dropwise addition, the stirring was further continued for 5 hours at a reaction temperature of 70° C. to complete the reaction. At the conclusion of heating, 0.04 g of paramethoxyphenol as a polymerization inhibitor was added to the reaction product. Then, it was condensed to 500 ml, and added to 4 l of hexane. Thus, a precipitate was obtained, and subjected to drying under vacuum. Yield was 61 g (56%). The intrinsic viscosity of the thus obtained copolymer measured at 30° C. in methyl ethyl ketone was 0.068.

Preferred examples of representative compounds having the above-described general formula (I-a) include allyl alcohol, 2-methylallyl alcohol, crotyl alcohol, 3-chloro-2-propene-1-ol, 3-phenyl-2-propene-1-ol, 3-(hydroxyphenyl)-2-propene-1-ol, 3-(2-hydroxyphenyl)-2-propene-1-ol, 3-(3,4-dihydroxyphenyl)-2-propene-1-ol, 3-(2,4-dihydroxyphenyl)-2-propene-1-ol, 3-(3,4,5-trihydroxyphenyl)-2-propene-1-ol, 3-(3-methoxy-4-hydroxyphenyl)-2-propene-1-ol, 3-(3,4-dihydroxy-5-methoxyphenyl)-2-propene-1-ol, 3-(3,5-dimethoxy-4-hydroxyphenyl)-2-propene-1-ol, 3-(2-hydroxy-4-methylphenyl)-2-propene-1-ol, 3-(4-methoxyphenyl)-2-propene-1-ol, 3-(4-ethoxyphenyl-2-propene-1-ol, 3-(2-methoxyphenyl)-2-propene-1-ol, 3-(3,4-dimethoxyphenyl)-2-propene-1-ol, 3-(3-methoxy-4-propoxyphenyl)-2-propene-1-ol, 3-(2,4,6-trimethoxyphenyl)-2-propene-1-ol, 3-(3-methoxy-4-benzyloxyphenyl)-2-propene-1-ol, 3-(3-(3'-methoxyphenyl)-4-benzyloxyphenyl)-2-propene-1-ol, 3-phenoxy-3-phenyl-2-propene-1-ol, 3-(3,4,5-trimethoxyphenyl)-2-propene-1-ol, 3-(4-methylphenyl)-2-propene-1-ol, 3-phenyl-3-(2,4,6-trimethylphenyl)-2-propene-1-ol,3,3-[di-(2,4,6-trimethylphenyl)]-2-propene-1-ol, 3-phenyl-3-(4-methylphenyl)-2-propene-1-ol, 3,3-diphenyl-2-propene-1-ol, 3-(2-chlorophenyl)-2-propene-1-ol, 3-(3-chlorophenyl)-2-propene-1-ol, 3-(4-chlorophenyl)-2-propene-1-ol, 3-(2,4-dichlorophenyl)-2-propene-1-ol, 3-(2-bromophenyl)-2-propene-1-ol, 3-bromo-3-phenyl-2-propene-1-ol, 3-chloro-3-phenyl-2-propene-1-ol, 3-(4-nitrophenyl)-2-propene-1-ol, 3-(2-nitrophenyl)-2-propene-1-ol, 3-(3-nitrophenyl)-2-propene-1-ol, 2-methyl-3-phenyl-2-propene-1-ol, 2-methyl-3-(4-chlorophenyl)-2-propene-1-ol, 2-methyl-3-(4-nitrophenyl)-2-propene-1-ol, 2-methyl-3-(4-aminophenyl)-2-propene-1-ol, 2-methyl-3,3-diphenyl-2-propene-1-ol, 2-ethyl-1,3-diphenyl-2-propene-1-ol, 2-ethoxymethylene-3-phenyl-2-propene-1-ol, 2-phenoxy-3-phenyl-2-propene-1-ol, 2-methyl-3-(4-methoxyphenyl)-2-propene-1-ol, 2,3-diphenyl-2-propene-1-ol, 1,2,3-triphenyl-2-propene-1-ol, 2,3,3-triphenyl-2-propene-1-ol, 2-ethoxy-3-phenyl-2-propene-1-ol, 1,3-diphenyl-2-propene-1-ol, 1-(4-methylphenyl)-3-phenyl-2-propene-1-ol, 1-phenyl-3-(4-methylphenyl)-2-propene-1-ol, 1-phenyl-3-(4-methoxyphenyl)-2-propene-1-ol, 1-(4-methoxyphenyl)-3-phenyl-2-propene-1-ol, 1,3-di(4-chlorophenyl)-propene-1-ol, 1-(4-bromophenyl)-3-phenyl-2-propene-1-ol, 1-phenyl-3-(4-nitrophenyl)-2-propene-1-ol, 1,3-di(2-nitrophenyl)-2-propene-1-ol, 1-(4-dimethylaminophenyl)-3-phenyl-2-propene-1-ol, 1-phenyl-3-(4-dimethylaminophenyl)-2-propene-1-ol, 1,1-di(4-dimethylaminophenyl)-3-phenyl-2-propene-1-ol, 1,1,3-triphenyl-2-propene-1-ol, 1,1,3,3-tetraphenyl-2-propene-1-ol, 1-(4-methlphenyl)-3-phenyl-2-propene-1-ol, 1-(dodecylsulfonyl)-3-phenyl-2-propene-1-ol, 1-phenyl-2-propene-1-ol, 1,2-diphenyl-2-propene-1-ol, 1-phenyl-2-methyl-2-propene-1-ol, 1-cyclohexyl-2-propene-1-ol, 1-phenoxy-2-propene-1-ol, 2-benzyl-2-propene-1-ol, 1,1-di(4-chlorophenyl)-2-propene-1-ol, 1-carboxy-2-propene-1-ol, 1-carboxyamido-2-propene-1-ol, 1-cyano-2-propene-1-ol, 1-suflo-2-propene-1-ol, 2-ethoxy-2-propene-1-ol, 2-amino-2-propene-1-ol, 3-(3-amino-4-methoxyphenylsulfonyl)-2-propene-1-ol, 3-(4-methylphenylsulfonyl)-2-propene-1-ol, 3-phenylsulfonyl-2-propene-1-ol, 3-benzylsulfonyl-2-propene-1-ol, 3-anilinosulfonyl-2-propene-1-ol, 3-(4-methoxyanilinosulfonyl)-2-propene-1-ol, 3-anilino-2-propene-1-ol, 3-naphthylamino-2-propene-1-ol, 3-phenoxy-2-propene-1-ol, 3-(2-methylphenyl)-2-propene-1-ol, 3-(3-methylphenoxy)-2-propene-1-ol, 3-(2,4-dimethylphenyl)-2-propene-1-ol, 1-methyl-3-carboxy-2-propene-1-ol, 3-carboxy-2-propene-1-ol, 3-bromo-3-carboxy-2-propene-1-ol, 1-carboxy-3-chloro-3-methyl-2-propene-1-ol, 1-carboxy-3-methyl-2-propene-1-ol, 1-(2-carbethoxyisopropyl)-3-methyl-2-propene-1-ol, 1-(1-carbethoxypropyl)-2-propene-1-ol, 1-(1-carbethoxyethyl)-3-methyl-2-propene-1-ol, 1-carbethoxy-3-chloro-3-methyl-2-propene-1-ol, 1-carbethoxymethylene-3-methyl-2-propene-1-ol, 1-amido-2,3-dimethyl-2-propene-1-ol, 1-cyano-3-methyl-2-propene-1-ol, 3-sulfo-2-propene-1-ol, 3-butoxy-2-propene-1-ol, 1-cyclohexyl-3-(2-hydroxycyclohexyl)-2-propene-1-ol, 3-cyclopentyl-2-propene-1-ol, 3-furyl-2-propene-1-ol, 3-chloro-2-propene-1-ol, 3-bromo-2-propene-1-ol, 2-methyl-3-chloro-2-propene-1-ol, 2-methyl-3-bromo-2-propene-1-ol, 1-carboisobutoxy-3-chloro-3-methyl-2-propene-1-ol, 2-chloro-3-phenyl-2-propene-1-ol (2-chlorocinnamyl alcohol), 2-bromo-3-phenyl-2-propene-1-ol (2-bromocinnamyl alcohol), 2-bromo-3-(4-nitrophenyl)-2-propene-1-ol, 2-fluoro-3-phenyl-2-propene-1-ol (2-fluorocinnamyl alcohol), 2-fluoro-3-(4-methoxyphenyl)-2-propene-1-ol, 2-nitro-3-chloro-3-phenyl-2-propene-1-ol, 2-nitro-3-phenyl-2-propene-1-ol (2-nitrocinnamyl alcohol), 2-cyano-3-phenyl-2-propene-1-ol (2-cyanocinnamyl alcohol), 2-chloro-2-propene-1-ol (2-chloroallyl alcohol), 2-bromo-2-propene-1-ol (2-bromoallyl alcohol), 2-carboxy-2-propene-1-ol (2-carboxyallyl alcohol), 2-carbethoxy-2-propene-1-ol (2-carbethoxyallyl alcohol), 2-sulfo-2-propene-1-ol (2-sulfoallyl alcohol), 2-nitro-2-propene-1-ol (2-nitroallyl alcohol), 2-bromo-3,3-difluoro-2-propene-1-ol, 2-chloro-3,3-difluoro-2-propene-1-ol, 2-fluoro-3-chloro-2-propene-1-ol, 2,3-dibromo-3-carboxy-2-propene-1-ol, 2,3-diiodo-3-carboxy-2-propene-1-ol, 2,3-dibromo-2-propene-1-ol and 2-chloro-3-methyl-2-propene-1-ol.

In addition, compounds wherein the alcohol at the 1-position in each of the specific compounds set forth above is replaced by thioalcohol, amino or halogen are, of course, included in the representative compounds of the formula (I-a).

Preferable ranges of the content of the unsaturated group and that of the carboxylic acid group in the polymer (A) are 10 to 90 mole % and 5 to 60 mole %, more particularly 20 to 70 mole % and 10 to 40 mole %, respectively by molar ratio upon copolymerization.

As for the unsaturated monomer employed as the component (B) in the photopolymerizing composition of this invention, compounds having at least one addition polymerizable unsaturated group are used to advantage. Particularly desirable examples of such compounds include ethylene glycol di(meth)acrylate, polyethylene glycol di(meth)acrylate, trimethylolethane, tri(meth)acrylate, trimethylolpropane tri(meth)acrylate, neopentylglycol di(meth)acrylate, tri-, tetra- or hexa(meth)acrylate of pentaerythritol or dipentaerythritol, epoxy di(meth)acrylate, the olygoacrylates as disclosed in published examined Japanese Patent Application No. 7361/'77, acryl-urethane resin as disclosed in published examined Japanese Patent Application No. 41708/'73, acryl-urethane olygomers and so on.

A compounding ratio of the above-described monomer or olygomer to the polymer (A) ranges from 1:9 to 7:3, preferably from 2.5:7.5 to 5:5, by weight.

Photopolymerization initiators which can be used as the component (C) in the photopolymerizing composition of this invention include vicinal polyketaldonyl compounds disclosed in U.S. Pat. No. 2,367,660; α-carbonyl compounds disclosed in U.S. Pat. Nos. 2,367,661 and 2,367,670; acyloin ethers disclosed in U.S. Pat. No. 2,448,828; aromatic acyloin compounds substituted with α-hydrocarbons disclosed in U.S. Pat. No. 2,722,512; polynuclear quinone compounds disclosed in U.S. Pat. Nos. 3,046,127 and 2,951,758; combinations of triarylimidazole dimers with p-aminophenyl ketones disclosed in U.S. Pat. No. 3,549,367; benzothiazole series compounds disclosed in U.S. Pat. No. 3,870,524; combinations of benzothiazole series compounds with trihalomethyl-s-triazine series compounds disclosed in U.S. Pat. No. 4,239,850; acridine and phenazine compounds disclosed in U.S. Pat. No. 3,751,259; and oxadiazole compounds disclosed in U.S. Pat. No. 4,212,970 (all of these U.S. Patents being incorporated herein by reference to disclose such compounds). Such a polymerization initiator is added in an amount of about 0.5 to about 15 wt%, preferably 2 to 10 wt.%, based on the total weight of the photopolymerizing composition.

In addition to the above-described components, the photopolymerizing composition of this invention preferably contains a thermopolymerization inhibitor, e.g., hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, etc., in an amount of less than 2 wt% based on a total weight of the composition, more preferably 100 to 1,000 ppm based on an amount of monomer. Optionally, the photopolymerizing composition can further contain a dye or a pigment for the purpose of coloring the photosensitive layer, and a pH indicator as a printing-out agent.

The photopolymerizing composition as described above is dissolved in a solvent, e.g., 2-methoxyethanol, 2-methoxyethylacetate, cyclohexane, methyl ethyl ketone, ethylene dichloride or the mixture prepared by properly compounding two or more of these solvents, and providing the composition on a support. A suitable dry coverage of the photopolymerizing composition ranges from about 0.1 g/m$^2$ to about 10 g/m$^2$, particularly from 0.5 to 5 g/m$^2$.

On the layer of the photopolymerizing composition provided on a support, it is desirable to provide a protective layer made up of a polymer excellent in shielding ability from oxygen, e.g. polyvinyl alcohol, acidic celluloses, etc., in order to prevent the polymerization inhibiting effect which oxygen in the air has when it contacts the photosensitive layer. A coating method for providing such a protective layer is described in detail in, e.g., U.S. Pat. No. 3,458,311 and British Pat. No. 1,441,339 (incorporated herein by reference to disclose such a method) and published examined Japanese Patent Application No. 49729/'80.

A lithographic printing plate is made using the presensitized plate of this invention in the following manner: Firstly, the presensitized printing plate is subjected to imagewise exposure using a light source rich in ultraviolet rays, such as a metal halide lamp, a high pressure mercuryl lamp or the like. Then, it is processed with a developing solution to remove the unexposed part of the photosensitive layer. Finally, a desensitizing gum is coated on the thus processed photosensitive layer. A preferred developing solution is an alkaline aqueous solution containing a small amount of organic solvent, such as benzyl alcohol, 2-phenoxyethanol, 2-butoxyethanol or the like. Specific examples of such a developing solution are described in, e.g., U.S. Pat. Nos. 3,475,171 and 3,615,490. Developing solutions described in published unexamined Japanese Patent Application No. 26601/'75 and published examined Japanese Patent Application No. 39464/'81 and U.S. Pat. No. 4,186,006 are also excellently suited to serve as the developing solution for the presensitized printing plate of this invention.

This invention will now be illustrated in more detail by reference to the following examples. However, the scope of the invention is not limited to these examples. Therein, all percentages are by weight unless otherwise indicated.

EXAMPLE 1

A base plate was prepared using the method disclosed in British Pat. No. 2,047,274. That is, a surface of a 0.24 mm-thick aluminium plate was subjected to a graining treatment using a nylon brush and an aqueous suspension of 400-mesh pumice, and washed thoroughly. Then, it was dipped in a 10% queous solution of sodium hydroxide at 70° C. for 60 seconds in order to etch its surface, washed with running water, rinsed with 20% HNO$_3$ for the purpose of neutralization, and washed again with water. Thereafter, it was subjected to an electrolytic surface-roughening treatment in a 1% aqueous solution of nitric acid by passing therethrough an alternating current having a shape of a sine wave with an electricity quantity of 160 coulomb/dm$^2$ under the condition that a voltage at the anode was 12.7 V and the ratio of the electricity quantity at the cathode to that at the anode was 0.8. The surface roughness of the thus processed plate was measured and found to be 0.6µ (by Ra representation). Successively, the plate was soaked in 30% sulfuric acid at 50° C. for 2 minutes in order to desmat its surface and then, subjected to an anodic oxidation treatment in 20% sulfuric acid by passing therethrough an electric current with a density of 2 A/dm$^2$ for a period of 2 minutes so that the resulting thickness of the base plate might become 2.7 g/m$^2$. Further, the base plate was dipped in a 70° C. 2.5% aqueous solution of sodium silicate for 1 minute, washed with water and dried. On the thus prepared base plate was coated a photosensitive composition having the following amounts of ingredients.

| Photosensitive Composition (1): | |
| --- | --- |
| Pentaerythritol Tetraacrylate | 1.75 g |
| Poly(allylmethacrylate/methacrylic acid) (Copolymerization molar ratio: 85/15) | 3.25 g |
| 2-Trichloromethyl-5-(p-n-butoxystyryl)-1,3,4-oxadiazole | 0.2 g |
| Oil Soluble Blue Dye (C.I. 42595) | 0.08 g |
| Methyl Ethyl Ketone | 20 g |
| 2-Methoxyethanol | 20 g |

The above-described composition was dissolved, filtered and coated on the base plate using a whirl-coating apparatus under the condition of about 2,000 r.p.m. Then, it was dried at 100° C. for 2 minutes. The dry coverage of the resulting coat was 3 g/m$^2$. Next, a 3 wt% aqueous solution of polyvinyl alcohol (having a viscosity of 5.3±0.5 cp when measured at 20° C. in a form of 4% solution using a Höppler viscometer, a saponification degree of 86.5 to 89.0 mol %, and a polymerization degree of 1000 or less) was coated on the surface of the photosensitive layer using a whirl-coating apparatus under the condition of about 180 r.p.m. The dry coverage of the thus provided protective layer was 1.5 g/m$^2$. The presensitized plate thus obtained was named Sample A.

The synthesizing process of poly(allylmethacrylate/methacrylic acid) used in the photosensitive composition described above is illustrated in detail below: In a 3-liter four neck flask equipped with an agitation rod and blade, a reflux condenser, a dropping funnel and a thermometer, 1.68 l of 1,2-dichloroethane was placed as a reaction solvent, and heated to 70° C. as the air in the flask was replaced by an atmosphere of nitrogen gas. 100.8 g of allylmethacrylate, 7.6 g of methacrylic acid and 1.68 g of 2,2'-azobis(2,4-dimethylvaleronitrile) as a polymerization initiator were dissolved in 0.44 l of 1,2-dichloroethane, and placed in the dropping funnel. The resulting mixed solution was dropwise added to the hot reaction solvent spending 2 hours with stirring. After the conclusion of dropwise addition, the reaction mixture was further stirred at 70° C. for 5 hours to complete the reaction. At the conclusion of heating, 0.04 g of paramethoxyphenol was added to the reaction product as a polymerization inhibitor, and the resulting solution was condensed to 500 ml. Then, the condensed solution was added to 4 l of hexane to precipitate the reaction product. After vacuum drying, 61 g (yield: 56%) of intended copolymer was obtained. The viscosity of the copolymer was $[\eta] = 0.068$ at 30° C. in a MEK solution.

Another presensitized printing plate was produced for comparison by coating a photosensitive composition (2), which was prepared in the same manner as the photosensitive composition (1) except that the same weight of poly(methylmethacrylate/methacrylic acid) having a copolymerization molar ratio of 90/10 was used in place of poly(allylmethacrylate/methacrylic acid), in the same manner as in the photosensitive composition (1) and by providing a layer of polyvinyl alcohol on the layer of photosensitive composition (2) in the same manner as in the production of Sample A. The thus produced presensitized printing plate was named Sample B.

On each of the presensitized printing plates, Sample A and Sample B, a gray scale tablet (made by Fuji Photo Film Co., Ltd.) and UGRA-GRETAG plate control wedge PCW were superposed, and exposed to light using a Berkey Printer (24×28 2 kW vacuum printer) (made by Pako Corporation). The exposed plate was dipped in a developing solution described below at a room temperature for 50 seconds and then, the resulting surface was softly rubbed with pads of cotton to remove the unexposed part of the photosensitive layer.

| Composition of Developing Solution: | |
|---|---|
| Sodium Sulfite | 5 g |
| Benzyl Alcohol | 30 g |
| Sodium Carbonate | 5 g |
| Sodium Isopropylnaphthalene-sulfonate | 12 g |
| Pure Water | 1,000 g |

Lithographic printing plates made under the conditions that surface temperatures of the glass frame of the printer at the time of exposure were 10° C. and 45° C. were named A-10 and A-45 respectively in the case of Sample A, and B-10 and B-45 respectively in the case of Sample B. When the surface temperature of the plate was raised from 10° C. to 45° C. upon exposure, sensitivity of the plate was increased by about 8 times in the case of Sample B, whereas only by about once or twice in the case of Sample A.

| | Difference in Sensitivity between at 45° C. and at 10° C. (Temperature Dependence) | Sensitivity Change (by-fold) | Dot-gaining (*1) |
|---|---|---|---|
| A | 1 to 2 steps in gray scale tablet | about 1.5 | 1% |
| B | 5 to 6 steps in gray scale tablet | about 8 | 7% |

*(1) Dot-gaining of Sample-45, compared with that of Sample-10, which was evaluated by medium tone in the 60 lines/cm halftone wedge part of the UGRA-GRETAG plate control wedge.

Using each of the thus made lithographic printing plates, printing was carried out on sheets of high quality paper with the aid of commercially available ink and a GTO printing machine made by Heiderberg AG. A great difference in tone reproducibility on prints obtained was observed between B-10 and B-45, whereas the difference was hardly observed between A-10 and A-45. Further, when the temperature dependence was compared by means of the UGRA-GRETAG plate control wedge (PCW), the halftone dots reproduced in B-45 was gained by 7% or more in the medium tone range, compared with those in B-10. On the other hand, such a gaining phenomenon was hardly observed between A-45 and A-10. As can be seen from the above-described results, the presensitized printing plate of this invention has greatly reduced temperature dependence.

EXAMPLE 2

Sample A and Sample B employed in Example 1 were optically exposed under the condition that the temperature of the glass frame of the printer was 15° C., and without delay they were subjected to development. The thus made printing plates were named A-1 and B-1 respectively. On the other hand, those subjected to development after the lapse of 1 hour from the optical exposure were named A-2 and B-2 respectively.

These samples were evaluated by the same experiments as in Example 1, and results set forth in the following table were obtained. Therefrom, it can be seen that latent image progression in the presensitized printing plate of this invention was remarkably reduced, compared with Sample B.

| | Difference in Sensitivity between Sample-1 and Sample-2 (Latent Image Progression) | Sensitivity Change (by-fold) | Dot-gaining |
|---|---|---|---|
| A | One step in gray scale tablet | about 1.5 | 0.5–1% |
| B | Four steps in gray scale tablet | about 4 | 4% |

EXAMPLE 3

Presensitized plates, C, D and E, were produced in the same manner as in Example 1 except that the following polymers, c, d and e respectively, were employed in place of poly(allylmethacrylate/methacrylic acid) in the photosensitive composition (1).

Polymer c: Poly(cinnamylmethacrylate/methacrylic acid) having a copolymerization molar ratio of 89.5/10.5.

Polymer d: Poly(crotylmethacrylate/methacrylic acid) having a copolymerization molar ratio of 83.3/16.7.

Polymer e: Poly(methallylmethacrylate/methacrylic acid) having a copolymerization molar ratio of 83.5/16.5.

Each of these plates was evaluated using the same methods as in Example 1 and Example 2. Excellent results as set forth in the following table were obtained.

| | Temperature Dependence | Sensitivity Change | Dot-gaining | Latent Image Progression |
|---|---|---|---|---|
| C | 3 steps | 2.8-fold | 0–2% | 1 step |
| D | 3 steps | 2.8-fold | 0–2% | 1 step |
| E | 3 steps | 2.8-fold | 0–2% | 1 step |

EXAMPLE 4

Presensitized plates, F and G, were produced in the same manner as in Example 1 except that the following polymers, f and g respectively, were employed in place of poly(allylmethacrylate/methacrylic acid) in the photosensitive composition (1).

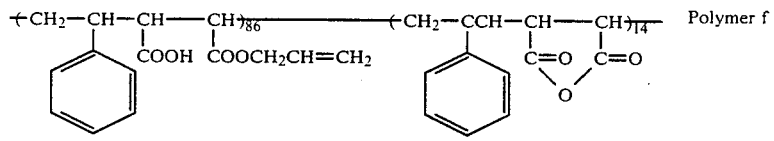

Polymer f

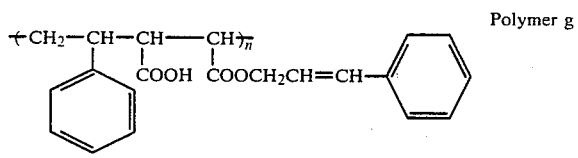

Polymer g

Each of these plates was evaluated using the same methods as described in Example 1 and Example 2, and the following results were obtained.

|   | Temperature Dependence | Sensitivity Change | Dot-gaining | Latent Image Progression |
|---|---|---|---|---|
| F | 2 steps | 2-fold | 0–1% | 2–3 steps |
| G | 3 steps | 2.8-fold | 1–3% | 2 steps |

EXAMPLE 5

Presensitized printing plates, H, I, J and K, were produced in the same manner as in Example 1 except that the following polymers, h, i, j and k respectively, were employed in place of poly(allylmethacrylate/methacrylic acid) in the photosensitive composition (1).

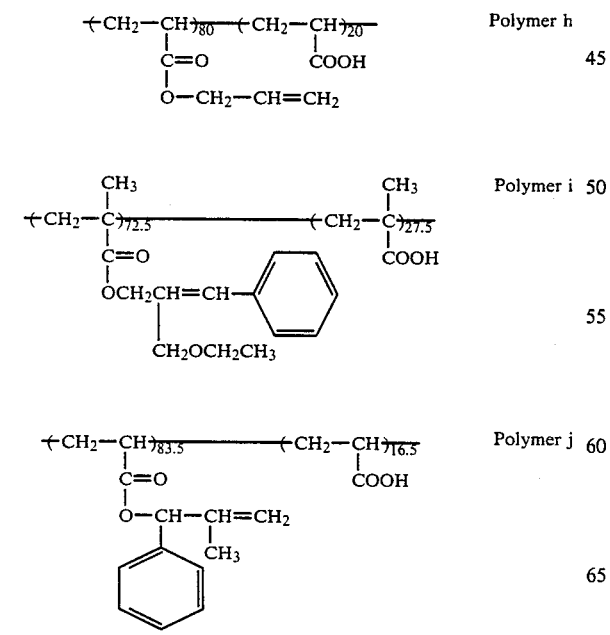

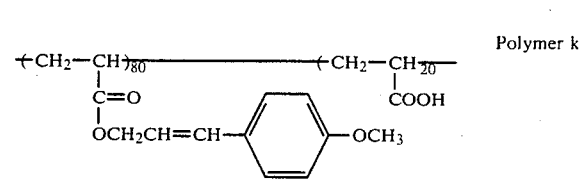

Polymer k

Each of these plates was evaluated using the same methods as described in Example 1 and Example 2, and the following results were obtained.

|   | Temperature Dependence | Sensitivity Change | Dot-gaining | Latent Image Progression |
|---|---|---|---|---|
| H | 2–3 steps | about 2.5-fold | 0–3% | 1–2 steps |
| I | 1–2 steps | about 2-fold | 1–2% | 1–2 steps |
| J | 2–3 steps | about 2.5-fold | 0–2% | 2 steps |
| K | 3 steps | about 2.8-fold | 1–3% | 2 steps |

While the invention has been described in detail and with reference to specific embodiment thereof, it will be apparent to one skilled in the art that various changes and modifications can be made therein without departing from the spirit and scope thereof.

What is claimed is:

1. A presensitized printing plate comprising:
   a support base having positioned thereon
   a photopolymerizable composition layer, the composition comprising:
   (A) a copolymer of allylmethacrylate and methacrylic acid;
   (B) a monomer or oligomer having at least two polymerizable ethylenically unsaturated double bonds; and
   (C) a photopolymerization initiator.

2. A presensitizing printing plate, as claimed in claim 1, wherein the support base is comprised of an aluminum plate.

3. A presensitizing printing plate, as claimed in claim 1, wherein the support base is comprised of a composite sheet comprising an aluminum sheet firmly attached to a polyethylene terephthalate film.

4. A presensitized printing plate, as claimed in claim 1, wherein the polymer (A) includes allylmethacrylate in an amount in the range of 10 to 90 mole % and includes the methacrylic acid in an amount in the range of 5 to 60 mole % by mole ratio upon copolymerization.

5. A presensitized printing plate, as claimed in claim 4, wherein the polymer (A) contains the allylmethacrylate in an amount in the range of 20 to 70 mole % and contains the methacrylic acid in an amount in the range of 10 to 40 mole % by mole ratio upon copolymerization.

6. A presensitized printing plate, as claimed in claim 1, wherein the component (B) is selected from the group consisting of ethylene glycol di(meth)acrylate, polyethylene glycol di(meth)acrylate, trimethylolethane tri(meth)acrylate, trimethylolpropane tri(meth)acrylate, neopentylglycol di(meth)acrylate, tri-, tetra- and hexa-(meth)acrylate of pentaerythritol or dipentaerythritol, epoxy di(meth)acrylate.

7. A presensitized printing plate, as claimed in claim 1, wherein the compounding ratio of the component (B) to the component (A) is in the range of 1:9 to 7:3 by weight.

8. A presensitized printing plate, as claimed in claim 7, wherein the compounding ratio of the component (B) to the component (A) is in the range of 2.5:7.5 to 5:5 by weight.

9. A presensitized printing plate, as claimed in claim 1, wherein the component (C) is present in an amount in the range of 0.5 to about 15 wt% based on the total weight of the photopolymerizing composition.

10. A presensitized printing plate, as claimed in claim 9, wherein the component (C) is present in an amount in the range of 2 to 10 wt% based on the total weight of the photopolymerizing composition.

11. A presensitized printing plate, as claimed in claim 1, wherein the photopolymerizing composition is present on the support base in a dry coverage amount in the range of from about 0.1 g/m$^2$ to about 10 g/m$^2$.

12. A presensitizing printing plate, as claimed in claim 11, wherein the photopolymerizing composition is present on the support base in a dry coverage amount in the range of from 0.5 to 5 g/m$^2$.

* * * * *